United States Patent [19]
Patel et al.

[11] Patent Number: 6,031,245
[45] Date of Patent: Feb. 29, 2000

[54] SEMICONDUCTOR DEVICE

[75] Inventors: Nalin Kumar Patel; Mark Levence Leadbeater; Llewellyn John Cooper, all of Cambridge, United Kingdom

[73] Assignee: Kabushiki Kaisha Toshiba, Kawasaki, Japan

[21] Appl. No.: 09/209,758

[22] Filed: Dec. 11, 1998

[30]         Foreign Application Priority Data

Dec. 12, 1997 [GB] United Kingdom .................... 9726376

[51] Int. Cl.[7] ................................................. H01L 29/06
[52] U.S. Cl. ................................................. 257/25; 257/14
[58] Field of Search ................................................. 257/25

[56]                     References Cited

U.S. PATENT DOCUMENTS 5,294,809  3/1994  Goronkin et al. ........................ 257/17
5,588,015  12/1996  Yang .

OTHER PUBLICATIONS

Mark Sweeny, et al., "Resonant Interband Tunnel Diodes", Applied Physics Letters, vol. 54, No. 6, Feb. 6, 1989, pp. 546–548.

*Primary Examiner*—Olik Chaudhuri
*Assistant Examiner*—Douglas A. Wille
*Attorney, Agent, or Firm*—Oblon, Spivak, McClelland, Maier & Neustadt, P.C.

[57]                     ABSTRACT

A semiconductor device is presented which exhibits both interband and intraband tunnelling. The device comprises two active layers (21, 23) which are sandwiched between two barrier layers (3, 5). These layers are located between first and second terminals (7, 9). The active layers (21, 23) are chosen such that the conduction band edge (27) of the first active layer (21) having a lower energy than the valence band edge (25) of the second active layer (23);

the first active layer (21) having a first confined conduction band energy level (29) with an energy higher than that of the conduction band edge (27) of the first active layer (21);

the second active layer (23) having a first confined valence band energy level (33) with an energy lower than that of the valence band edge (25) of the second active layer (23);

wherein the first confined valence band energy level (33) and the first confined conduction band energy level (29) are located such that the device can exhibit both intraband and interband tunnelling.

12 Claims, 4 Drawing Sheets

SEMICONDUCTOR DEVICE

FIELD OF INVENTION

The present invention relates to a semiconductor device. The device in question is of a kind normally referred to as a tunnelling device and particularly a resonant tunnelling device.

BACKGROUND OF INVENTION

The resonant tunnelling device was originally described by L. L. Chang el al. Appl. Phys. Lett., 24 595 (1974). The conventional resonant tunnelling device is in the form of a diode, although the terminals are often called the 'collector' and the 'emitter'. Typically the device comprises a quantum well layer (e.g. GaAs) on either side of which is located a respective barrier layer (e.g. AlGaAs).

With this conventional kind of device, application of a bias voltage between the emitter and the collector causes conduction through the layers. At low voltages only a small current flows. However as the bias voltage increases, so does the current. When the energy matches that of a quasi-bound state in the quantum well, electrons can tunnel through the barrier layers so that current freely flows from emitter to collector. At this bias voltage, the quantum well is said to be on resonance, and this value of the bias may be termed the 'resonant voltage'.

As the bias voltage is increased beyond the resonant voltage the energy becomes higher than that of the quasi bound state so that tunnelling is inhibited. This gives rise to a region of negative differential resistance above the resonant peak in the IV characteristic. Thus sweeping the collector-emitter bias voltage from a voltage below the resonant voltage to a voltage above the resonant voltage shows a peak in the tunnelling current centred around the resonant voltage, this peak in termed the tunnelling peak.

Since tunnelling is a very fast mechanism of charge transport resonant tunnelling devices offer the potential of extremely high speed operation. They have been described as oscillators (e.g. T. C. L. G Sollner et al. Appl. Phys Lett., 45 1319 (1984)) and switches (e.g. S. K. Diamond et al. Appl. Phys Lett., 54 153 (1989)). Oscillation frequencies up to 712 Ghz have been reported. These devices can be fabricated as far infrared detectors.

Progress in this field has been reviewed in two parts by M. Henini et al. III–V's Review, 7 33 (1994) (Part 1) and III–V's Review, 7 46 (1994) (Part 2).

For production of a good RTD, optimisation of the tunnelling peak characteristics are required. A large difference between the magnitude of the tunnelling current on resonance and off resonance, termed the peak to valley ratio, is required. A fast operating speed also requires a small voltage range over which the device can be switched from the peak current to the valley current.

Previously, most devices of this type have worked on the principle of intraband resonant tunnelling where electrons are injected from the conduction band of the emitter into a conduction band energy state of the quantum well. However, intraband resonant tunnelling devices where electrons are injected from the conduction band into a valence band of the quantum well have also been proposed. In these types of device, resonant tunnelling occurs when the carriers are injected with an energy corresponding to that of a bound state in the valence band. Above the valence band edge lies the band gap. Here there are no states which the carriers can tunnel into. Therefore, once the injected carrier energy is increased above the valance band edge. Tunnelling is suppressed by the band gap.

These devices have been proposed using the antimonide system (J. R. Söderström et al. Appl. Phys. Lett 55 1094 (1989)). These devices have been found to exhibit a very low valley current and hence an enhanced Peak to valley ratio. The reason for this is that the electrons are injected into states with an energy below that of the band gap (i.e. the valence band). As the injection energy of the electrons is increased, the energy becomes level with that of the band gap. The electrons cannot tunnel through the band-gap as there are no available states to tunnel into. Hence, tunnelling is effectively suppressed.

An optical device based on the antimonide system is described in U.S. Pat. No. 5,588,015.

SUMMARY OF THE INVENTION

The present invention provides a device which can exhibit the high peak current from intraband tunnelling along with the low valley current due to the band-gap blocking effect associated with interband tunnelling. Therefore, in a first aspect, the present invention a semiconductor device comprising:

a) first and second active semiconductor layers;
b) first and second barrier layers; and
c) first and second terminals;

wherein the said first barrier layer is provided overlying the said first terminal, the said first active layer is provided overlying the said first barrier layer, the said second active layer is provided overlying and in contact with the said first active layer, the said second barrier layer is provided overlying the said second active layer and the said second terminal is provided overlying the said second barrier layer, the conduction band edge of the said first active layer having a lower energy than the valence band edge of the said second active layer;

the said first active layer having a first confined conduction band energy level with an energy higher than that of the conduction band edge of the said first active layer;

the second active layer having a first confined valence band energy level with an energy lower than that of the valence band edge of the said second active layer;

wherein the first confined valence band energy level and the first confined conduction band energy level are located at the same energy to form an aligned energy level.

For the avoidance of doubt, if a first layer is described as overlying a second layer, the first layer is situated on an opposite side of the second layer to the substrate. The term overlying does not necessarily mean that the overlying layers are in contact with one another.

A device according to a first aspect of the present invention has an aligned energy level. This aligned energy level can be formed when no bias is applied or preferably when a bias is applied across the device. Thus for the avoidance of doubt, the phrase "wherein the first confined valence band energy level and the first confined conduction band energy level are located at the same energy to form an aligned energy level." is to be interpreted to cover both the situation where without application of a bias the two confined energy levels align and also the case where only upon application of a bias the two confined energy levels align.

The application of a bias can fulfil two functions, it can modulate the energy of the injected carriers and it can change the relative separation of the first confined valence band state and the first confined conduction band state. When a bias is applied across the above device such that carriers are injected at the aligned energy level, the carriers resonantly tunnel from the emitter to the collector. At this bias, the device exhibits a peak tunnel current.

A minimum current can be reached by changing the applied emitter collector bias so that carriers are injected with an energy which is in the band gap of the second active layer. There are no states within the band-gap which the injected carriers can tunnel into. Therefore, tunnelling is greatly suppressed and a very low valley current is observed.

The above two states can respectively termed the on-state and the off-state.

Therefore, according to a second aspect, the present invention provides a semiconductor tunnelling device with an on and off state, the device comprising:

a) first and second active semiconductor layers;
b) first and second barrier layers; and
c) first and second terminals,
  wherein the said first barrier layer is provided overlying the said first terminal, the said first active layer is provided overlying the said first barrier layer, the said second active layer is provided overlying and in contact with the said first active layer, the said second barrier layer is provided overlying the said second active layer and the said second terminal is provided overlying the said second barrier layer,
  the conduction band edge of the said first active layer having a lower energy than the valence band edge of the said second active layer;
  the said first active layer having a first confined conduction band energy level with an energy higher than that of the conduction band edge of the said first active layer;
  the said second active layer having a said first confined valence band energy level with an energy lower than that of the valence band edge of the said second active layer;
  wherein the first confined valence band energy level and the first confined conduction band energy level are capable of being located at the same energy to form an aligned energy level,
  a bias being applied across the device to inject carriers at different energies dependent on the bias applied, the bias being applied so as to switch the device between an on state and an off state,
  wherein in the off state, carriers are injected at an energy level which falls between the conduction and valence band edges of the second active layer, and in the on state a bias is applied such that the aligned energy level is formed and carriers are injected with an energy level corresponding to that of the said aligned energy level.

In a third aspect, the present invention provides a semiconductor device comprising:

a) first and second active semiconductor layers of the same conductivity type;
b) first and second barrier layers; and
c) first and second terminals, wherein the said first barrier layer is provided overlying the first terminal, the said first active layer is provided overlying the said first barrier layer, the said second active layer is provided overlying the said first active layer, the said second barrier layer is provided overlying the said second active layer and the said second terminal is provided overlying the said second barrier layer,
  the conduction band edge of the said first active layer having a lower energy than the valence band edge of the said second active layer;
  the said first active layer having a first confined conduction band energy level with an energy higher than that of the conduction band edge of the said first active layer;
  the said second active layer having a first confined valence band energy level with an energy lower than that of the valence band edge of the said second active layer,
  wherein the first confined valence band energy level and the first confined conduction band energy level are located at the same energy to form an aligned energy level.

In a fourth aspect, the present invention provides a semiconductor tunnelling device with an on and off state, the device comprising:

a) first and second active semiconductor layers of the same conductivity type;
b) first and second barrier layers; and
c) first and second terminals;
  wherein the said first barrier layer is provided overlying the said first terminal, the first said active layer is provided overlying the said first barrier layer, the said second active layer is provided overlying the said first active layer, the said second barrier layer is provided overlying the said second active layer and the said second terminal is provided overlying the said second barrier layer,
  the conduction band edge of the said first active layer having a lower energy than the valence band edge of the said second active layer;
  the said first active layer having a first confined conduction band energy level with an energy higher than that of the conduction band edge of the first active layer;
  the said second active layer having a said first confined valence band energy level with an energy lower than that of the valence band edge of the second active layer,
  wherein the first confined valence band energy level and the first confined conduction band energy level are capable of being located at the same energy to form an aligned energy level
  a bias being applied across the device to inject carriers at different energies dependent on the bias applied, the bias being applied so as to switch the device between an on state and an off state,
  wherein in the off state, carriers are injected at an energy level which falls between the conduction and valence band edges of the said second active layer, and
  in the on state a bias is applied such that the aligned energy level is formed and carriers are injected with an energy level corresponding to that of the said aligned energy level.

In the third and fourth aspects of the present invention, the first and second terminals are of the same conductivity type i.e. either p-type or n-type which allows easier fabrication of the device.

The above advantages can be also realised when the first confined conduction band energy level and the first confined valence band energy level do not align at the energy of the injected carriers i.e. there is a small offset between the two levels. In such a device, there will be two 'on states', a first on state where the tunnelling current is mainly due to intraband tunnelling, a second on-state where the tunnelling current is predominantly due to interband tunnelling and an off-state where the tunnelling current is suppressed due to the band-gap of the second active layer.

Therefore, in a fifth aspect, the present invention provides a semiconductor tunnelling device comprising:
  a) first and second active semiconductor layers;
  b) first and second barrier layers; and
  c) first and second terminals;
    wherein the said first barrier layer is provided overlying the said first terminal, the first active layer is provided overlying the said first barrier layer, the said second active layer is provided overlying the said first active layer, the said second barrier layer is provided overlying the said second active layer and the said second terminal is provided overlying the said second barrier layer,
    the conduction band edge of the said first active layer having a lower energy than the valence band edge of the said second active layer;
    the said first active layer having a first confined conduction band energy level with an energy higher than that of the conduction band edge of the said first active layer;
    the said second active layer having a first confined valence band energy level with an energy lower than that of the valence band edge of the second active layer,
    a bias being applied across the device to inject carriers at different levels dependent on the bias applied, the bias being applied so as to switch the device between first and second current flowing states and an off state,
    wherein in the off state, carriers are injected at an energy level which falls between the conduction and valence band edges of the second active layer, in the first current carrying state, carriers are injected with an energy level of the first confined valence band state;
    and in the second current carrying state, carriers are injected into the device with an energy level of the first confined conduction band state.

Thus, by sweeping the bias voltages the device can be switched between interband tunnelling (first current carrying state), intraband tunnelling (second current carrying state) and an off state where current flow is blocked by the barrier provided by the band gap of the first active layer.

To clarify the above, a bias is applied across the device such that vertical transport substantially perpendicular to the layers of the device takes place. In order for resonant tunnelling to take place, the barrier layers must be thin enough to allow the carriers to pass through them when one or more of the energy levels in the active layers is aligned with the energy of the injected carriers. Therefore, it is preferable if the barrier layers are less than 10 nm wide, it is more preferable if the barrier layers are less than 5 nm wide.

The antimonide based system is preferable because of its large band offsets. The antimonide system is also particularly preferable because of its ability to form low resistance contacts. Therefore, it is preferable if the first active semiconductor layer is InAs and the second active semiconductor layer is GaSb. It is more preferable if the first and second barrier layers are AlSb.

In such a device, it is preferable if the terminals are of the same conductivity type, more preferably one of the terminals is n-type InAs. Even more preferably, both terminals are n-type InAs.

The separation of the confined energy levels is determined by a bias (if any) applied to the device and the width of the first and second active layers during fabrication. However, the spacing of the confined energy levels could be further tuned after fabrication by applying pressure to the device. Therefore, to provide fine tuning, it may be preferable if a device according to the present invention is subjected to pressure.

If the second active layer is GaSb the position of the confined energy levels may be further altered during fabrication by adding either In or Al to the GaSb layer during formation of the layer.

The above description and the following specific description have generally been described with reference to a system where electrons are carriers. However, it will be appreciated by a person skilled in the art that the first and/or second terminal could be p-type and holes are injected across the system.

Also, it will be appreciated by a person skilled in the art that either the first or second terminal can act as the emitter (i.e. inject carriers) depending on the bias applied across the device.

BRIEF DESCRIPTION OF THE DRAWINGS

The present invention will now be described with reference to specific non limiting embodiments in which FIGS. 1 (a)–(b) is a schematic diagram of a typical intraband tunnelling device.

DETAILED DESCRIPTION OF THE INVENTION

The examples will mainly be described with electrons as carriers. However, it will be appreciated by those skilled in the art that the devices can easily be adapted for hole injection.

FIG. 1 shows a typical intraband resonant tunnelling diode. The diode has a quantum well 1 which is located between two barriers 3 and 5. On the outside of the structure are two terminals, namely an emitter 7 and a collector 9.

Figure 1A:
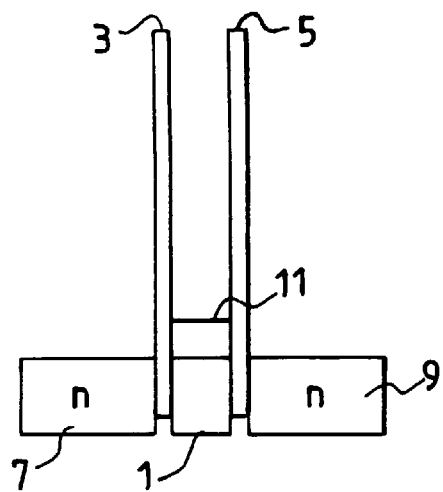
Figure 1B:
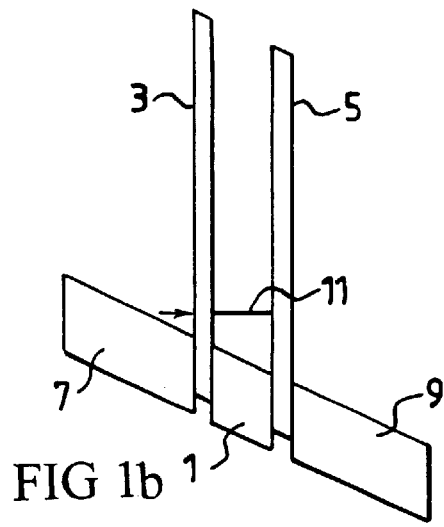

FIG. 1a shows the structure with no bias applied and FIG. 1b shows the structure with an applied bias. When a bias is applied the energy of the electrons in the emitter increases until the electron energy of the injected electrons becomes equal to that of the bound state 11 in the quantum well. Once this happens, electrons can resonantly tunnel through the quantum well to the collector 9.

As the bias is increased further, the energy of the injected electrons becomes higher than that of the quantum well and resonant tunnelling is suppressed. As higher energy levels than the single level 11 exist, the tunnelling current off resonance does not go to zero. Therefore it is hard to obtain a good peak to valley ratio in such a device.

Figure 2A:
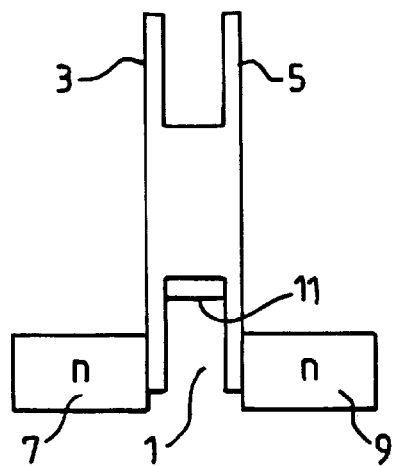
FIGS. 2 (a)–(b) is a schematic diagram of a typical interband tunnelling device.
Figure 2B:
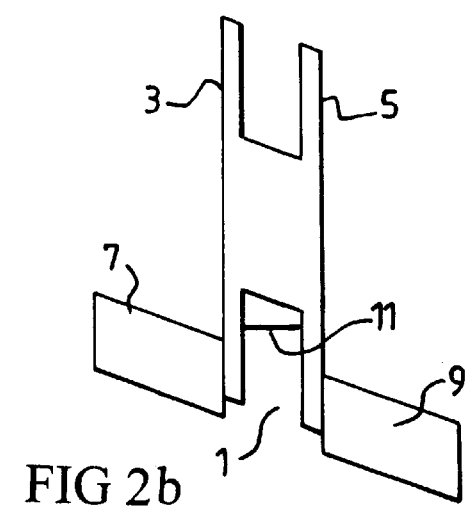

FIG. 2 shows a device which is similar in operation to that of FIG. 1. However, here, the energy level of the injected electrons needs to be level with a valence band energy state 11. The advantage of this structure is that as the energy of the injected electrons is raised beyond the resonance, the energy of the injected electrons rises into the band-gap of the active layer. No states are present here, and, as a result tunnelling is suppressed. Thus, these devices produce low valley currents.

Figure 3:
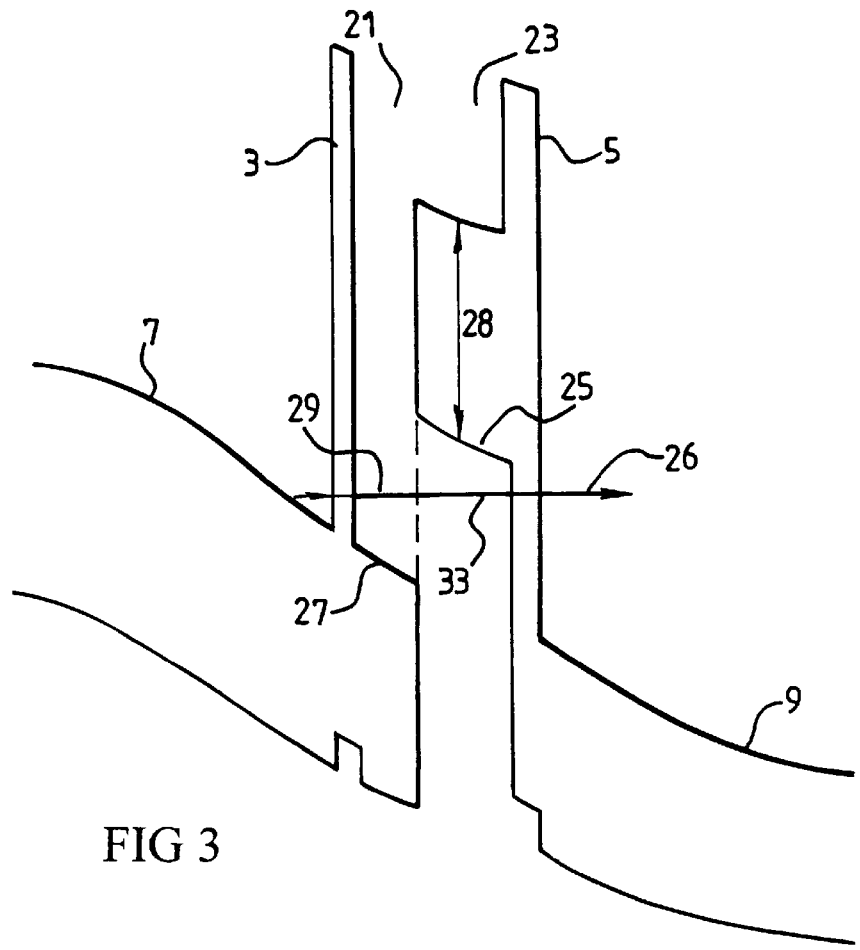
FIG. 3 is a schematic diagram of a resonant tunnelling device in accordance with a first aspect of the present invention.

FIG. 3 shows a schematic band structure of a device which benefits from both interband and intraband resonant tunnelling. The device is similar to that of FIGS. 1 and 2. Except here, the active region is made up of two semiconductor layers, a first active layer 21 and a second active layer 23. The first 21 and second 23 active layers form a type II heterojunction i.e. the valence band edge 25 of the second active layer 23 lies above the conduction band edge 25 of the first active layer 21.

Due to the confinement potential within the first 21 and second 23 active layers, confined energy states are formed. A first confined energy level 29 (which is a conduction band energy level) is formed within the first active layer 21 and a second confined energy level 33 (which is a valence band energy level) is formed in the second active layer 23. The first 29 and second 33 confined energy levels align to form a single level.

When carriers are injected with an energy corresponding to the aligned level, a tunnelling current flows due to both intraband and interband resonant tunnelling. If the energy of the injected electrons is increased, the injected electron energy is taken off-resonance and the tunnel current falls. A small tunnel current flows when the device is off resonance because there are still energy levels available which the injected electrons can scatter into. However, once the injected carrier energy becomes level with the band-gap 28 of the second active layer, tunnelling is greatly suppressed. This is because there are no states in the band-gap and hence there are no states which the carriers an scatter into (the band-gap effectively blocks the tunnelling). Therefore, this device possesses an enhanced peak current due to both interband and intraband resonant tunnelling and a very low valley current due to the band gap blocking tunnelling.

FIG. 4 shows a device which can (as in the device shown in FIG. 3) exhibit both interband and intraband tunnelling. However, here, the energy levels are not completely aligned. As interband and intraband tunnelling occur at different biases, results from this device (FIG. 5) are particularly useful for illustrating the mechanisms at work in both this device and the device shown in FIG. 3 where the energy levels are aligned.

Figure 4A:
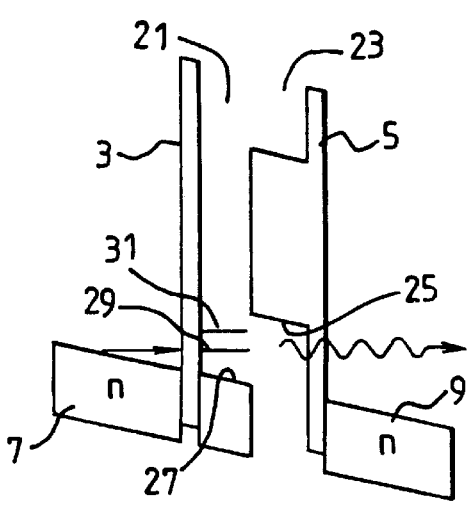
FIGS. 4 (a)–(b) is a plot of current against bias voltage for a device in accordance with a second aspect of the present invention.

In FIG. 4a, the second active layer 21 has two energy levels with an energy higher than the conduction band edge has two confined energy levels 29, 31. The position of these levels is determined by the level of confinement in the active layer and the width of the active layer 21. For the device to exhibit intraband resonant tunnelling, the energy of the injected electrons must be equal to the energy of one of the confined energy levels of the conduction band.

Figure 4B:
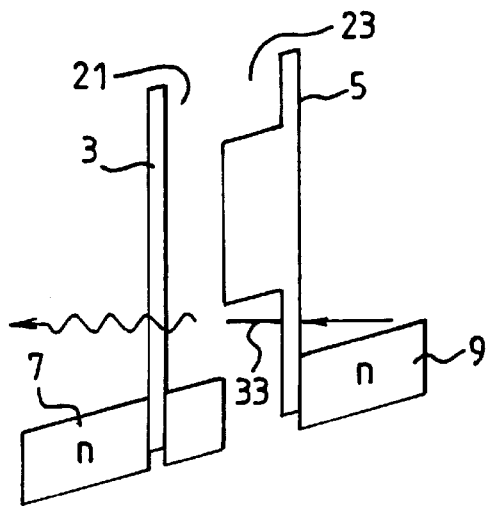

FIG. 4b shows the energy levels formed in the first active layer. Confined energy level 33 is formed with an energy less than that of the valence band edge 25. Electrons injected with an energy equal to that of the confined valence band energy level can resonantly tunnel through the structure. As the energy is raised, tunnelling is blocked due to the complete absence of states in the band gap of layer 23.

Therefore, the structure as shown in FIG. 4 has 3 main modes of operation, two current carrying modes (interband resonant tunnelling and intraband resonant tunnelling) and an off mode where the valley current is at a minimum due to tunnelling being blocked by the band gap.

Figure 5:
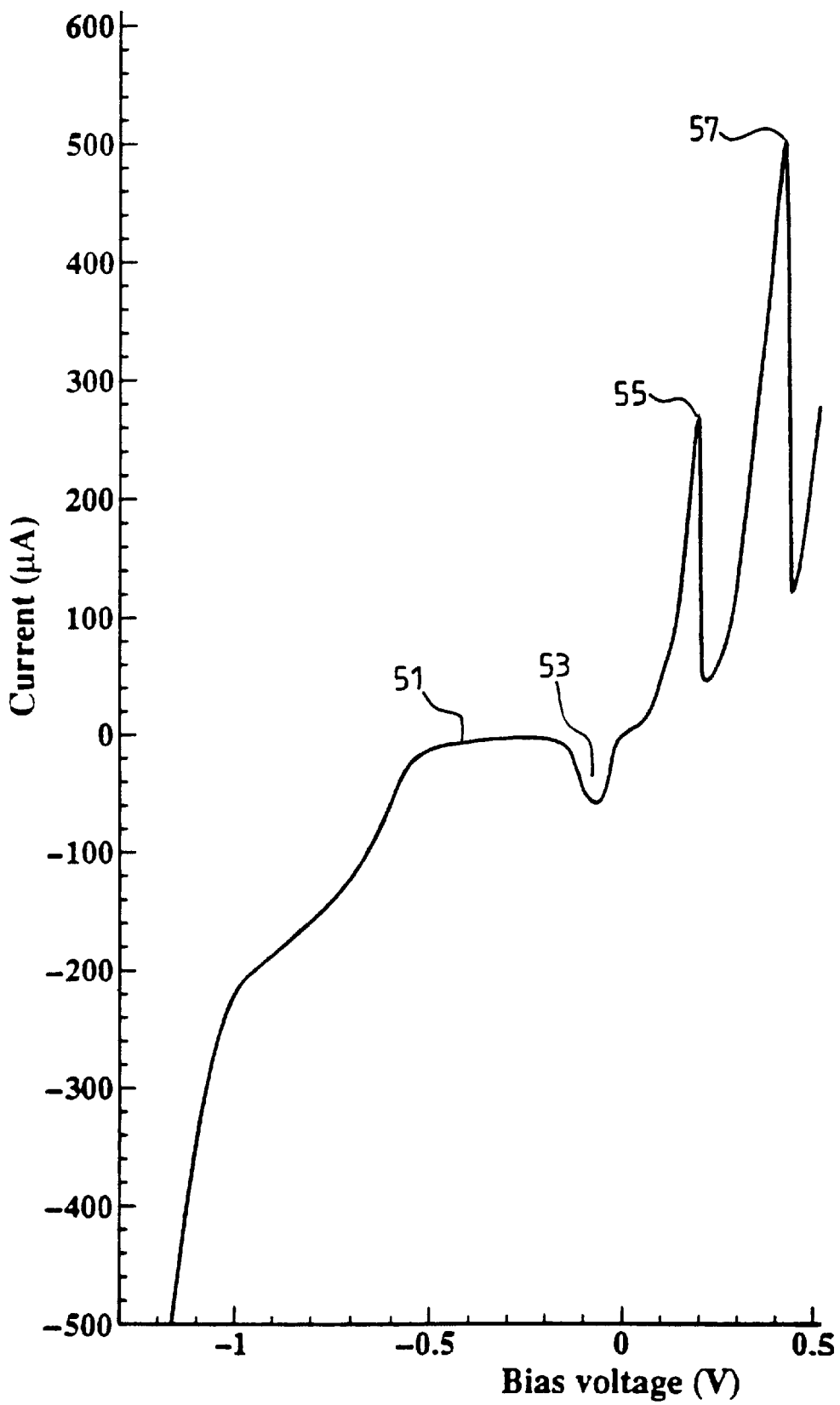
FIG. 5 is a schematic diagram of a device in accordance with a second aspect of the present invention.

These three modes of operation are clearly illustrated in the results of FIG. 5. The bias applied between the emitter and collector is swept through zero. For negative biases, a flat region where virtually no current flows is observed. This region corresponds to where any tunnelling is blocked by the band gap of the first active layer. As the negative bias is reduced in magnitude a dip 53 is seen which corresponds to interband tunnelling as shown in FIGS. 3 and 4.

The bias is then swept through zero two peaks are seen 55, 57. The first of these peaks 55 is due to the injected electron energy equalling that of the first confined conduction band state. In this case a second excited conduction band state is also formed. The tunnelling peak 57 is due to intraband tunnelling through this second state.

Figure 6:
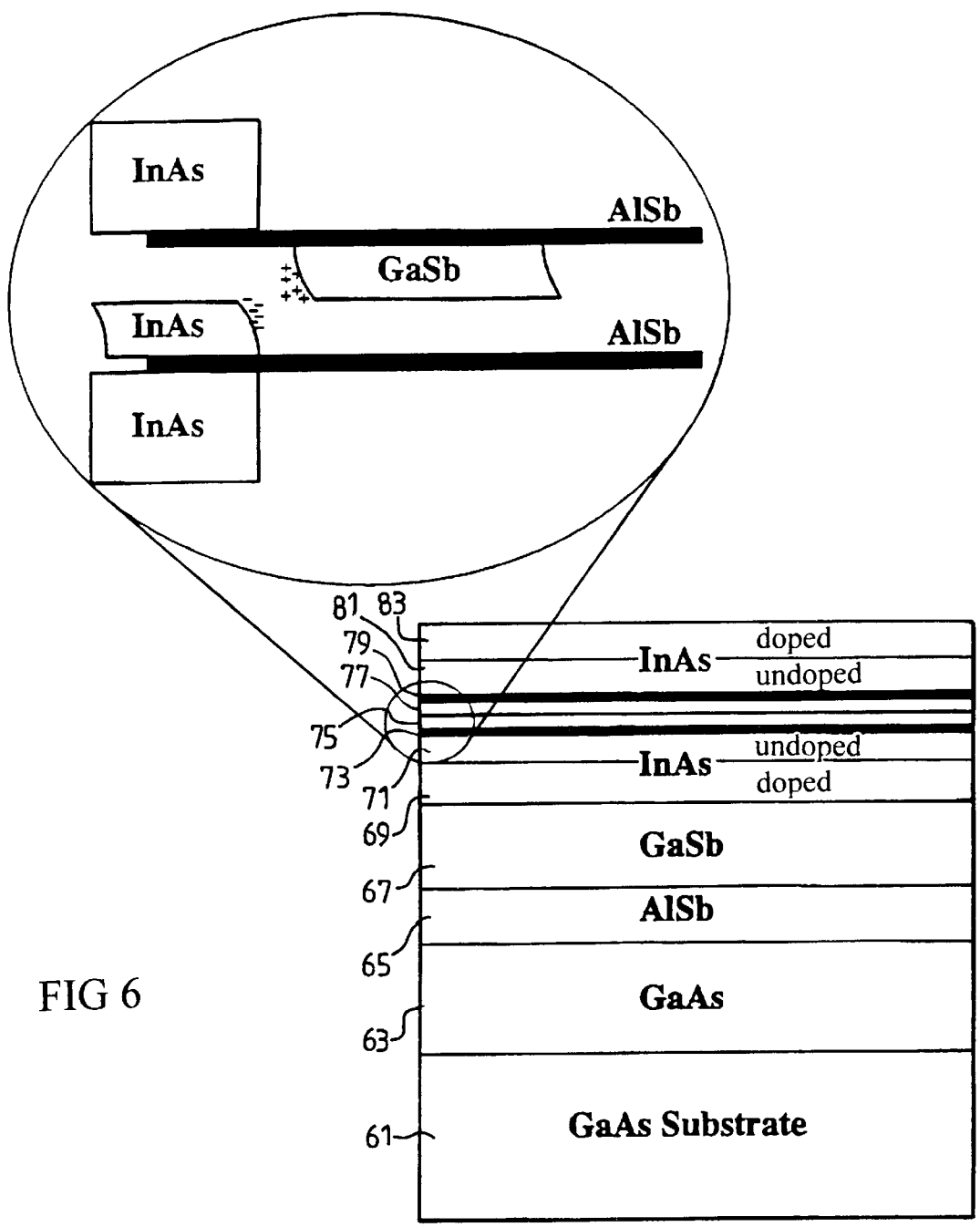
FIG. 6 is a schematic layer structure of a device in accordance with either a first or second aspect of the present invention.

The layer structure of such a device is shown in detail in FIG. 6. A GaAs buffer layer 63 is formed overlying and in contact with an upper surface of a GaAs semi-insulating substrate 61. On top of the GaAs buffer layer 63 is formed a AlSb buffer layer 65. Overlying and in contact with the upper surface of the AlSb layer is formed an undoped GaSb layer 67.

The active region of the structure is then formed. A first collector layer 69 is formed overlying and in contact with the GaSb layer 67. The layer is formed from 200 nm of doped InAs. A second collector layer 71 of 50 nm undoped InAs is formed overlying and in contact with the first collector layer 69. Overlying and in contact with the second collector layer 71 is a first barrier layer 73 of 3 nm undoped AlSb. The first active layer 75 of 15 nm of undoped InAs is then formed overlying the first barrier layer 73 and the second active layer 77 of 15 nm of undoped GaSb is formed overlying the first active layer 75. Optionally, a third 3 nm AlSb barrier layer is formed between the two active layers 75 and 77.

A second barrier layer 79 of 3 nm undoped AlSb is formed overlying the second active layer 77. A second emitter layer 81 of 50 nm undoped InAs is formed overlying the second barrier layer 79 and finally, the structure is finished with a first emitter layer 83 of 200 nm doped InAs is then formed overlying the second emitter layer 81.

A bias is applied across the device by making ohmic contacts to the first layers of the emitter 83 and the collector 69. Typically, contact will be made using NiGeAu ohmic contacts.

First and second active layers are formed from InAs and GaSb respectively. As required by all aspects of the present invention, the valance band edge of the second active layer 77 lies above the conduction band edge of the first active layer 55.

Although the invention has been specifically described and illustrated with respect to the preferred embodiments which can represent applications of the principles of the invention, it should be understood by those skilled in the art that all variations and modifications in form and details may be made therein without departing from the spirit and scope of the invention which should be limited only by the scope of the claims.

We claim:

1. A semiconductor tunnelling device comprising:
   a) first and second active semiconductor layers;
   b) first and second barrier layers; and
   c) first and second terminals;
   wherein the said first barrier layer is provided overlying the said first terminal, the first active layer is provided overlying the said first barrier layer, the said second active layer is provided overlying the said first active layer, the said second barrier layer is provided overlying the said second active layer and the said second terminal is provided overlying the said second barrier layer, the conduction band edge of the said first active layer having a lower energy than the valence band edge of the said second active layer;

the said first active layer having a first confined conduction band energy level with an energy higher than that of the conduction band edge of the said first active layer;

the said second active layer having a first confined valence band energy level with an energy lower than that of the valence band edge of the second active layer;

a bias being applied across the device to inject carriers at different levels dependent on the bias applied, the bias being applied so as to switch the device between first and second current flowing states and an off state, wherein in the off state, carriers are injected at an energy level which falls between the conduction and valence band edges of the second active layer, in the first current carrying state, carriers are injected with an energy level of the first confined valence band state;

and in the second current carrying state, carriers are injected into the device with an energy level of the first confined conduction band state.

2. The semiconductor device of claim 1, wherein the first active semiconductor layer is InAs and the second active semiconductor layer is GaSb.

3. The semiconductor device of claim 2, wherein an element chosen from the group of Al or In is added to the GaSb active layer.

4. The semiconductor device of claim 1, wherein the first and second barrier layers are AlSb.

5. The semiconductor device of claim 1, wherein the first active layer has two or more confined energy states.

6. The semiconductor device of claim 1, wherein the second active layer has two or more confined energy states.

7. A semiconductor device comprising:

a) first and second active semiconductor layers;

b) first and second barrier layers; and c) first and second terminals;

wherein the said first barrier layer is provided overlying the said first terminal, the said first active layer is provided overlying the said first barrier layer, the said second active layer is provided overlying and in contact with the said first active layer, the said second barrier layer is provided overlying the said second active layer and the said second terminal is provided overlying the said second barrier layer, the conduction band edge of the said first active layer having a lower energy than the valence band edge of the said second active layer;

the said first active layer having a first confined conduction band energy level with an energy higher than that of the conduction band edge of the said first active layer;

the second active layer having a first confined valence band energy level with an energy lower than that of the valence band edge of the said second active layer, wherein the first confined valence band energy level and the first confined conduction band energy level are located at the same energy to form an aligned energy level.

8. The semiconductor device of claim 7, wherein the first and second active layers are subjected to pressure.

9. A semiconductor tunnelling device with an on and off state, the device comprising:

a) first and second active semiconductor layers;

b) first and second barrier layers; and c) first and second terminals, wherein the said first barrier layer is provided overlying the said first terminal, the said first active layer is provided overlying the said first barrier layer, the said second active layer is provided overlying and in contact with the said first active layer, the said second barrier layer is provided overlying the said second active layer and the said second terminal is provided overlying the said second barrier layer, the conduction band edge of the said first active layer having a lower energy than the valence band edge of the said second active layer;

the said first active layer having a first confined conduction band energy level with an energy higher than that of the conduction band edge of the said first active layer;

the said second active layer having a said first confined valence band energy level with an energy lower than that of the valence band edge of the said second active layer;

wherein the first confined valence band energy level and the first confined conduction band energy level are capable of being located at the same energy to form an aligned energy level, a bias being applied across the device to inject carriers at different energies dependent on the bias applied, the bias being applied so as to switch the device between an on state and an off state, wherein in the off state, carriers are injected at an energy level which falls between the conduction and valence band edges of the second active layer, and in the on state a bias is applied such that the aligned energy level is formed and carriers are injected with an energy level corresponding to that of the said aligned energy level.

10. A semiconductor device comprising:

a) first and second active semiconductor layers of the same conductivity type;

b) first and second barrier layers; and c) first and second terminals, wherein the said first barrier layer is provided overlying the first terminal, the said first active layer is provided overlying the said first barrier layer, the said second active layer is provided overlying the said first active layer, the said second barrier layer is provided overlying the said second active layer and the said second terminal is provided overlying the said second barrier layer, the conduction band edge of the said first active layer having a lower energy than the valence band edge of the said second active layer;

the said first active layer having a first confined conduction band energy level with an energy higher than that of the conduction band edge of the said first active layer;

the said second active layer having a first confined valence band energy level with an energy lower than that of the valence band edge of the said second active layer;

where in the first confined valence band energy level and the first confined conduction band energy level are located at the same energy to form an aligned energy level.

11. The semiconductor device of claim 10, wherein both of the first and second terminals are n-type InAs.

12. A semiconductor tunnelling device with an on and off state, the device comprising:
   a) first and second active semiconductor layers of the same conductivity type;
   b) first and second barrier layers; and
   c) first and second terminals;
      wherein the said first barrier layer is provided overlying the said first terminal, the first said active layer is provided overlying the said first barrier layer, the said second active layer is provided overlying the said first active layer, the said second barrier layer is provided overlying the said second active layer and the said second terminal is provided overlying the said second barrier layer,
      the conduction band edge of the said first active layer having a lower energy than the valence band edge of the said second active layer;
      the said first active layer having a first confined conduction band energy level with an energy higher than that of the conduction band edge of the first active layer,
      the said second active layer having a said first confined valence band energy level with an energy lower than that of the valence band edge of the second active layer,
      wherein the first confined valence band energy level and the first confined conduction band energy level are capable of being located at the same energy to form an aligned energy level,
      a bias being applied across the device to inject carriers at different energies dependent on the bias applied, the bias being applied so as to switch the device between an on state and an off state,
         wherein in the off state, carriers are injected at an energy level which falls between the conduction and valence band edges of the said second active layer, and
         in the on state a bias is applied such that the aligned energy level is formed and carriers are injected with an energy level corresponding to that of the said aligned energy level.

* * * * *